( 12 ) United States Patent
Flachowsky et al.

(10) Patent No.: US 8,476,131 B2
(45) Date of Patent: Jul. 2, 2013

(54) METHODS OF FORMING A SEMICONDUCTOR DEVICE WITH RECESSED SOURCE/DESIGN REGIONS, AND A SEMICONDUCTOR DEVICE COMPRISING SAME

(75) Inventors: Stefan Flachowsky, Dresden (DE); Ralf Illgen, Dresden (DE); Thilo Scheiper, Dresden (DE); Ricardo P. Mikalo, Heideblick (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 118 days.

(21) Appl. No.: 13/216,791

(22) Filed: Aug. 24, 2011

(65) Prior Publication Data

US 2013/0049126 A1    Feb. 28, 2013

(51) Int. Cl.
*H01L 21/8238*  (2006.01)
*H01L 21/331*  (2006.01)

(52) U.S. Cl.
USPC ............. 438/231; 438/305; 257/E21.409; 257/E21.632; 257/E27.062

(58) Field of Classification Search
USPC ........... 438/231, 305; 257/E21.409, E27.062
See application file for complete search history.

(56) References Cited

U.S. PATENT DOCUMENTS

| 5,705,840 | A | 1/1998 | Shen et al. |
| 5,780,350 | A * | 7/1998 | Kapoor ................. 438/305 |
| 6,380,088 | B1 | 4/2002 | Chan et al. |
| 6,420,218 | B1 | 7/2002 | Yu |
| 7,091,071 | B2 | 8/2006 | Thean et al. |
| 7,755,171 | B2 | 7/2010 | Zhu |
| 2006/0131648 | A1 | 6/2006 | Ahn et al. |
| 2010/0025771 | A1* | 2/2010 | Hoentschel et al. ........ 257/369 |
| 2010/0164005 | A1* | 7/2010 | Yu et al. .................... 257/369 |
| 2011/0278673 | A1 | 11/2011 | Fuller et al. |

* cited by examiner

*Primary Examiner* — David S Blum
(74) *Attorney, Agent, or Firm* — Williams, Morgan & Amerson, P.C.

(57) ABSTRACT

In one example, a method disclosed herein includes forming a gate electrode structure for a PMOS transistor and a gate electrode structure for a NMOS transistor, forming a plurality of cavities in the substrate proximate the gate electrode structure of the PMOS transistor and performing an epitaxial deposition process to form raised silicon-germanium regions is the cavities. The method concludes with the step of performing a common etching process on the PMOS transistor and the NMOS transistor to define recessed regions in the substrate proximate the gate electrode structure of the NMOS transistor and to reduce the amount of the silicon-germanium material positioned above the surface of the substrate for the PMOS transistor.

15 Claims, 8 Drawing Sheets

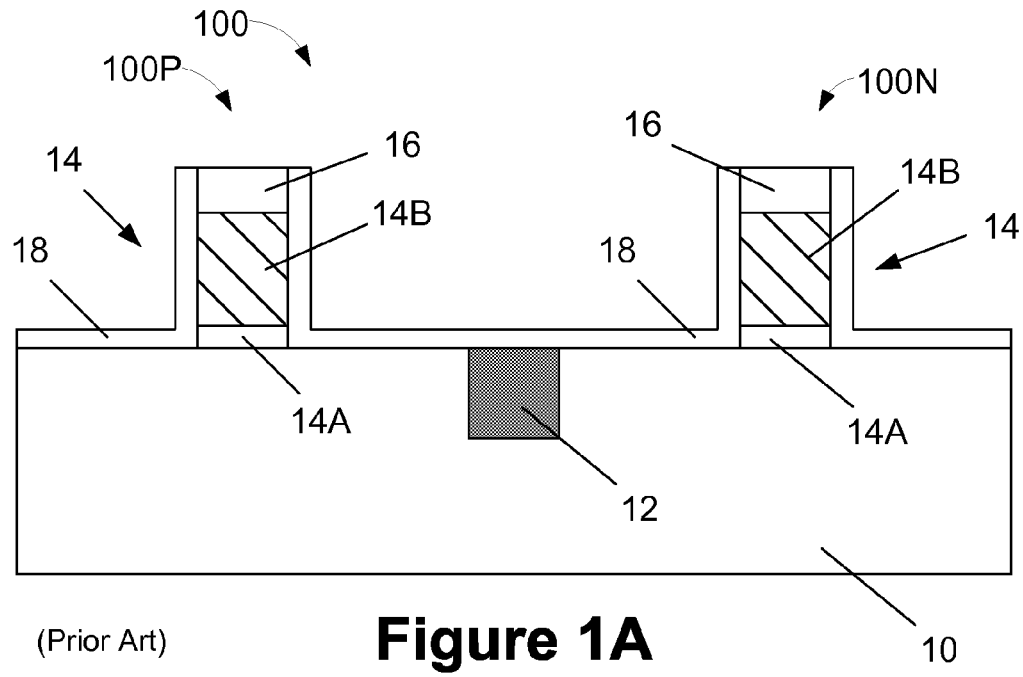
(Prior Art) Figure 1A
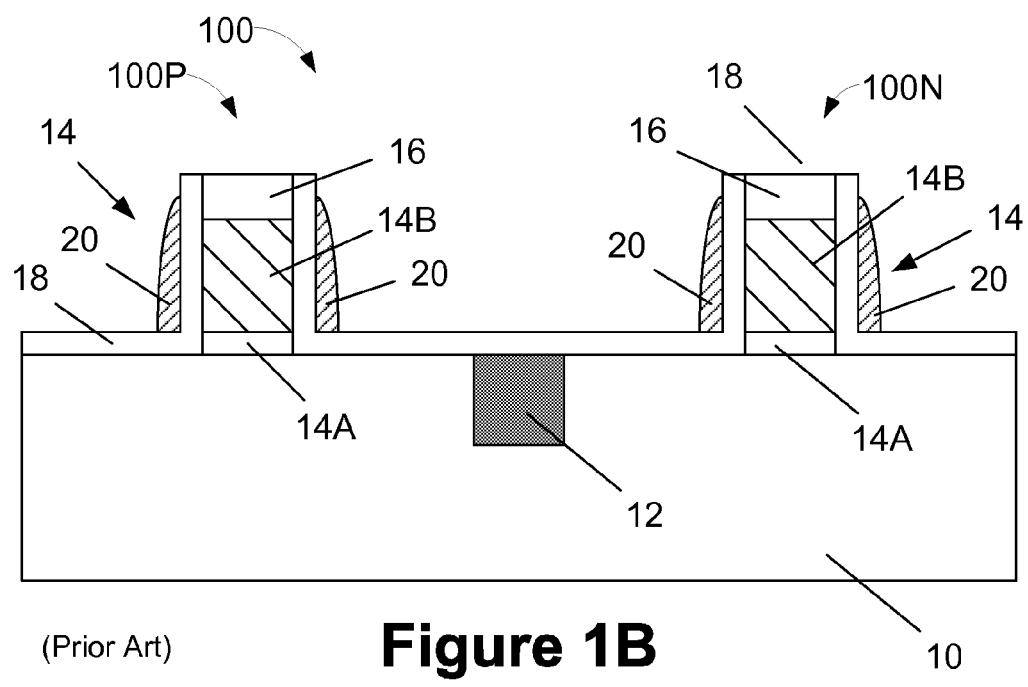
(Prior Art) Figure 1B

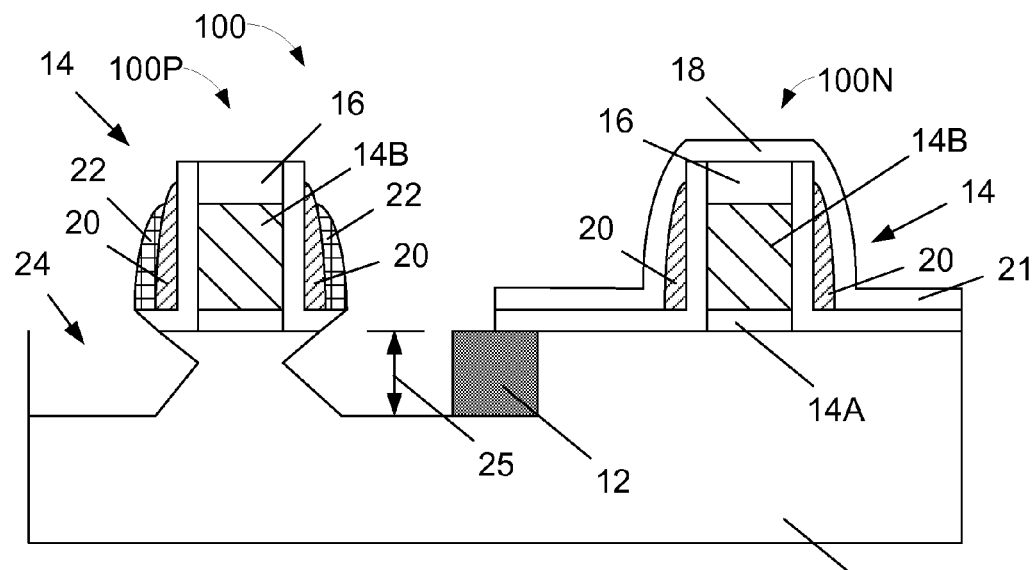
(Prior Art) Figure 1C
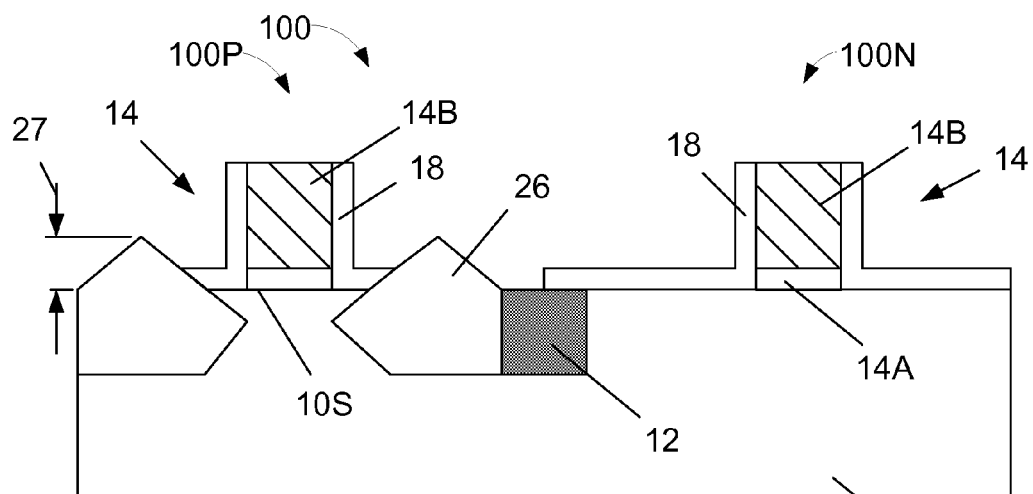
(Prior Art) Figure 1D

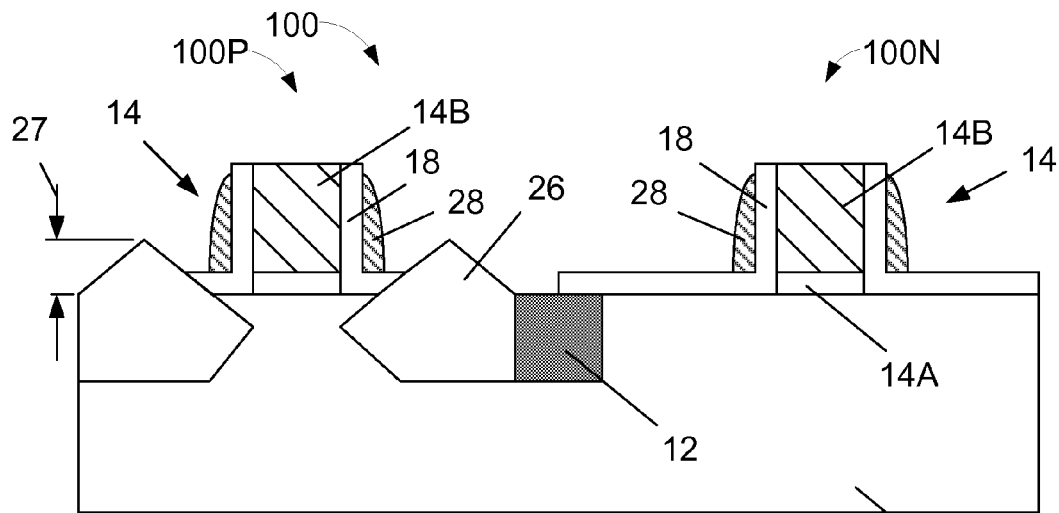
(Prior Art) Figure 1E
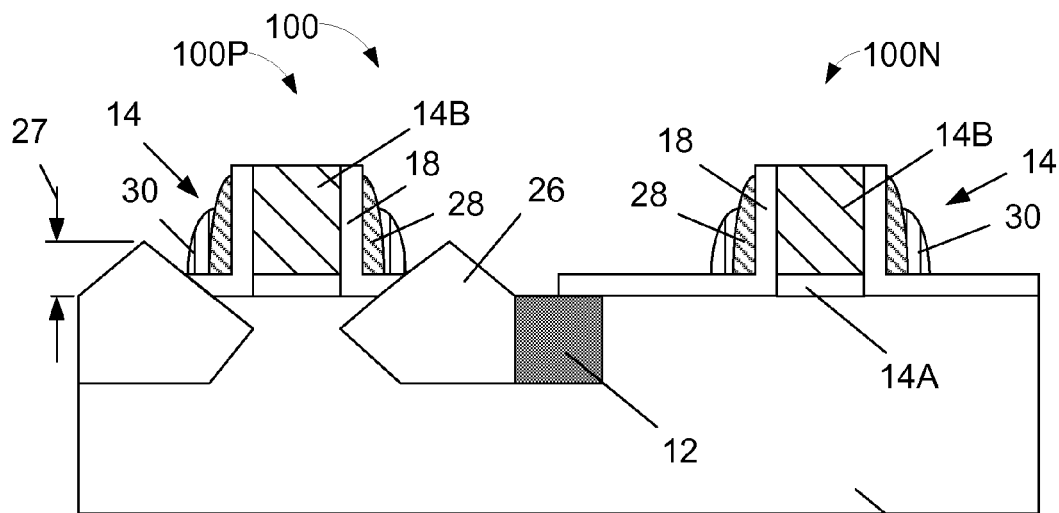
(Prior Art) Figure 1F

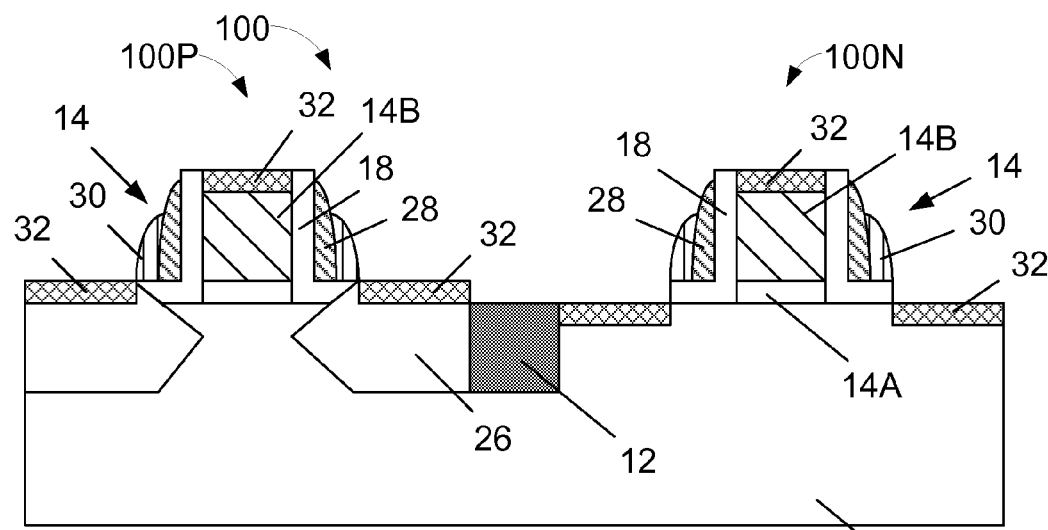
(Prior Art) Figure 1G
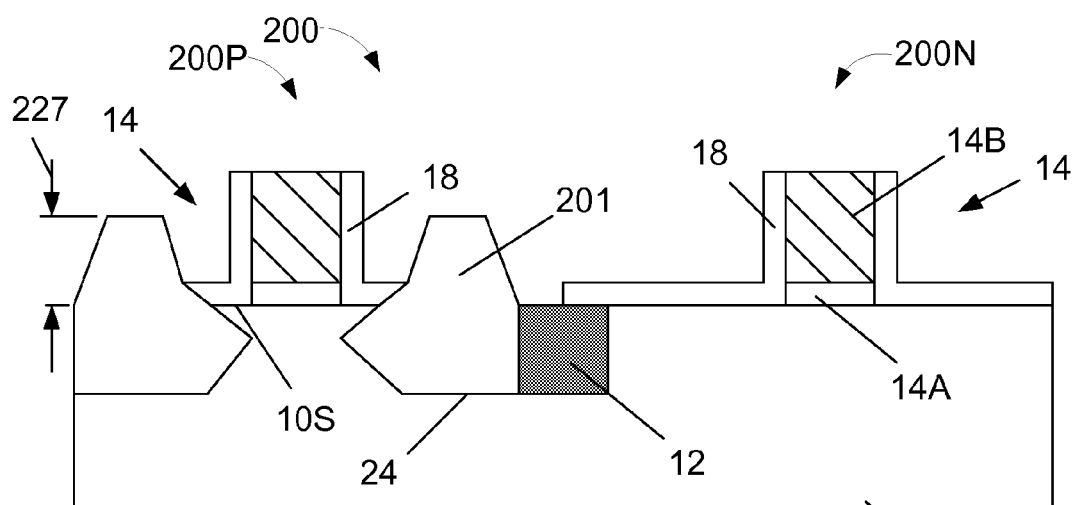
Figure 2A

METHODS OF FORMING A SEMICONDUCTOR DEVICE WITH RECESSED SOURCE/DESIGN REGIONS, AND A SEMICONDUCTOR DEVICE COMPRISING SAME

BACKGROUND OF THE INVENTION

1. Field of the Invention

Generally, the present disclosure relates to the manufacturing of sophisticated semiconductor devices, and, more specifically, to various methods of forming a semiconductor device with recessed source/drain regions, and a semiconductor device that includes such regions.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit elements that substantially determine performance of the integrated circuits. During the fabrication of complex integrated circuits using, for instance, MOS technology, millions of transistors, e.g., NMOS transistors and/or PMOS transistors are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped regions source/drain regions.

In a field effect transistor, the conductivity of the channel region, i.e., the drive current capability of the conductive channel is controlled by a gate electrode formed adjacent to the channel region and separated therefrom by a thin gate insulation layer. The conductivity of the channel region, upon formation of a conductive channel due to the application of an appropriate control voltage to the gate electrode, depends upon, among other things, the dopant concentration, the mobility of the charge carriers and, for a given extension of the channel region in the transistor width direction, the distance between the source and drain regions, which is also referred to as the channel length of the transistor. Hence, in combination with the capability of rapidly creating a conductive channel below the insulating layer upon application of the control voltage to the gate electrode, the conductivity of the channel region substantially affects the performance of MOS transistors. Thus, since the speed of creating the channel, which depends in part on the conductivity of the gate electrode, and the channel resistivity substantially determine the characteristics of the transistor, the scaling of the channel length, and associated therewith the reduction of channel resistivity, are dominant design efforts used to increase the operating speed of the integrated circuits.

The formation of transistors typically involves performing one or more ion implantation processes to form various doped regions in the substrate, such as halo implant region, extension implant regions and deep source/drain implant regions. In many of the cases, one or more sidewall spacers are formed adjacent a gate electrode structure so as to control the location of the various implant regions. Typically, these sidewall spacers are made of silicon nitride to facilitate processing. More specifically, silicon nitride is often selected because it can be readily etched, and thus removed, relative to a silicon substrate and an underlying silicon dioxide liner layer which is frequently present to act as an etch stop layer when the silicon nitride spacer is removed.

FIGS. 1A-1G depict one illustrative prior art process flow for forming a semiconductor device 100 that includes an illustrative PMOS transistor 100P and an illustrative NMOS transistor 100N using an illustrative combination of silicon nitride sidewall spacers. As shown in FIG. 1A, the process begins with the formation of illustrative gate electrode structures 14 for the PMOS transistor 100P and the NMOS transistor 100N in and above regions of the substrate 10 that are separated by an illustrative shallow trench isolation structure 12. The gate electrode structures 14 generally include a gate insulation layer 14A and one or more conductive gate electrode layers 14B. A gate cap layer 16, made of a material such as silicon nitride, is formed above the gate structures 14. Also depicted in FIG. 1A is an illustrative liner layer 18, made of a material such as silicon dioxide having a thickness of approximately 3-5 nm, that is conformally deposited on the device 100. The gate electrode structures 14 depicted herein are intended to be schematic and representative in nature, as the materials of construction used in the gate structures 14 may be different for the PMOS transistor 100P as compared to the NMOS transistor 100N, e.g., the PMOS transistor 100P may have multiple layers of conductive metal, etc. The gate insulation layer 14A may be comprised of a variety of materials, such as silicon dioxide, silicon oxynitride, a high-k (k value greater than 10) insulating material. The gate electrode layer 14B may be comprised of one or more layers of conductive materials, such as polysilicon, a metal, etc. The structure depicted in FIG. 1A may be formed by a performing a variety of know techniques. For example, the layers of material that make up the gate insulation layer 14A, the gate electrode layer 14B and the gate cap layer 16 may be blanket-deposited above the substrate 10 and, thereafter, one or more etching process are performed through a patterned mask layer (not shown) to define the basic structures depicted in FIG. 1A. Thereafter, a conformal deposition process is performed to form the liner layer 18.

FIG. 1B depicts the device 100 after several process operations have been performed. More specifically, illustrative silicon nitride sidewall spacers 20 with an illustrative base width of about 5-10 nm are formed adjacent the liner layer 18 for both the PMOS transistor 100P and the NMOS transistor 100N. The spacers 20 may be formed by depositing a layer of spacer material and thereafter performing anisotropic etching process. Exposed horizontal portions of the oxide liner layer 18 are removed after the spacers are formed. Next, a masking layer (not shown), e.g., such a photoresist mask, is formed so as to cover the NMOS transistor 100N and expose the PMOS transistor 100P for further processing. Then, one or more ion implantation processes are performed on the exposed PMOS transistor 100P to form various doped regions in the substrate 10, although such doped regions are not depicted in the drawing for purposes of clarity. More specifically, at the point depicted in FIG. 1B, an ion implant process may be performed using an N-type dopant material to form so-called halo implant regions in the substrate 10 for the PMOS transistor 100P, and another ion implant process may be performed using a P-type dopant material to form extension implant regions for the PMOS transistor 100P. Thereafter, a very quick anneal process, such as a laser anneal process, may be performed at a temperature of about 1250° C. for about 10 milliseconds or so to repair the damaged lattice structure of the substrate 10 in the areas that were subjected to the ion implant processes discussed above.

FIG. 1C also depicts the device 100 after several process operations have been performed on the device 100. More specifically, a hard mask layer 21, made of a material such as silicon nitride, is formed above the NMOS transistor 100N. The hard mask layer 21 may be formed by blanket-depositing the hard mask layer 21 across the device 100 and, thereafter, forming a masking layer (not shown), e.g., such a photoresist mask so as to cover the NMOS transistor 100N and expose the PMOS transistor 100P for further processing. Then an etching process is performed to remove the hard mask layer 21 from above the PMOS transistor 100P. Thereafter, a second sidewall spacer 22 made of, for example, silicon nitride, is formed adjacent sidewall spacer 20 on the PMOS transistor 100P. The spacer 22 may be formed by depositing a layer of spacer material and thereafter performing an anisotropic etching process. In some embodiments, the spacer 22 may have a base width of about 4-8 nm. Next, one or more etching processes are performed to define cavities 24 in areas of substrate 10 where source/drain regions for the PMOS transistor 100P will ultimately be formed. The depth and shape of the cavities 24 may vary depending upon the particular application. In one example, where the cavities 24 have an overall depth 25 of about 70 nm, the cavities 24 may be formed by performing an initial dry anisotropic etching process to a depth of about 40-50 nm and thereafter, performing a wet etching process using, for example TMAH, which has an etch rate that varies based upon the crystalline structure of the substrate 10, e.g., the etching process using TMAH exhibits a higher etch rate in the 110 direction than it does in the 100 direction.

FIG. 1D depicts the device 100 after an epitaxial deposition process is performed to form epitaxial silicon germanium regions 26 in the cavities 24. In the depicted example, the regions 26 have an overfill portion that extends above the surface 10S of the substrate 10. In the depicted example, the uppermost surface of the epitaxial silicon germanium regions 26 extends above the substrate 10 by a distance 27 of about 25 nm. The regions 26 may be formed by performing well know epitaxial deposition processes. The device 100 in FIG. 1D has also be subjected to an etching process using, for example, hot phosphoric acid, to remove all of the exposed nitride materials, such as the hard mask layer 21, the sidewall spacers 20, the sidewall spacers 22 and the gate cape layer 16.

As shown in FIG. 1E, the original liner layer 18 may remain in place. Alternatively, the original liner layer 18 may be removed and new liner layer comprised of, for example, 3-5 nm of silicon dioxide, may be formed it its place. Thereafter, illustrative silicon nitride sidewall spacers 28 with an illustrative base width of about 5-10 nm are formed adjacent the liner layer 18 for both the PMOS transistor 100P and the NMOS transistor 100N. The spacers 28 may be formed by depositing a layer of spacer material and thereafter performing an anisotropic etching process. Next, a masking layer (not shown), e.g., such a photoresist mask, is formed so as to cover the PMOS transistor 100P and expose the NMOS transistor 100N for further processing. Then, one or more ion implantation processes are performed on the exposed NMOS transistor 100N to form various doped regions in the substrate 10, although such doped regions are not depicted in the drawing for purposes of clarity. More specifically, at the point depicted in FIG. 1E, an ion implant process may be performed using an P-type dopant material to form so-called halo implant regions in the substrate 10 for the NMOS transistor 100N, and another ion implant process may be performed using a N-type dopant material to form extension implant regions for the NMOS transistor 100N. Thereafter, a very quick anneal process, such as a laser anneal process, may be performed at a temperature of about 1250° C. for about 10 milliseconds or so to repair the damaged lattice structure of the substrate 10 in the areas that were subjected to the ion implant processes discussed above.

Next, as shown in FIG. 1F, silicon nitride sidewall spacers 30 are formed form both the PMOS transistor 100P and the NMOS transistor 100N. Although not depicted in the drawings, another conformal liner layer of, for example, 3-5 nm of silicon dioxide, may be formed so as to cover the spacers 28 prior to forming the spacers 30. Thereafter, deep source/drain ion implant processes are performed on the PMOS transistor 100P and the NMOS transistor 100N using appropriate masking layers and appropriate dopant materials, all of which are well known to those skilled in the art, to form source/drain implant regions (not shown) in the substrate 10. One or more anneal processes are then performed to repair lattice damage to the substrate and to activate the implanted dopant material.

FIG. 1G depicts the device 100 after metal silicide regions 32 have been formed on the device 100. The metal silicide regions 32 may be made of any metal silicide and they may be formed using traditional silicidation techniques. The metal silicide regions 32 need not be the same metal silicide material on both the PMOS transistor 100P and the NMOS transistor 100N, although that may be the case. Although not depicted in the drawings, the fabrication of the device 100 would include several additional steps such as the formation of a plurality of conductive contacts or plugs in a layer of insulating material so as to establish electrical connection with the source/drain regions of the transistors.

In a basic transistor, there are one or more conductive contact plugs that are used for electrical connection to the source/drain regions of the transistor. This arrangement creates an undesirable capacitor (two conductors separated by a dielectric material) between the gate electrode and the conductive contact plugs. This undesirable fringe capacitor must be charged and discharged every switching cycle of the transistor. In many cases, this dielectric material consists of the silicon nitride spacers discussed above that are used in forming the various doped regions for the transistors, i.e., the extension regions and source/drain regions. One problem with the aforementioned use of silicon nitride spacers is that they have a significantly higher dielectric constant (k of about 6.7) as compared to, for example, silicon dioxide (k of about 3.9). As a result of the foregoing, the use of silicon nitride spacers tends to deteriorate the dynamic switching speed of the transistor as the current used to charge/uncharge the fringe capacitor is not available for current transportation. Such problems may result in a circuit exhibiting longer rise/fall times for a given switching cycle. This problem may be even more problematic for a PMOS transistor 100P given the amount of the overfill of the epitaxial silicon germanium regions 26 which tends to create areas where more silicon nitride material can accumulate as compared to an NMOS transistor.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a semiconductor device with recessed source/drain regions, and a semiconductor device that includes such regions. In one example, a method disclosed herein includes forming a gate electrode structure for a PMOS transistor and a gate electrode structure for a NMOS transistor, forming a plurality of cavities in the substrate proximate the gate electrode structure of the PMOS transistor and performing an epitaxial deposition process to form raised silicon-germanium regions is the cavities. The method concludes with the step of performing a common etching process on the PMOS transistor and the NMOS transistor to define recessed regions in the substrate proximate the gate electrode structure of the NMOS transistor and to reduce the amount of the silicon-germanium material positioned above the surface of the substrate for the PMOS transistor.

In another illustrative example, a method disclosed herein includes forming a gate electrode structure of a NMOS transistor above a surface of a semiconducting substrate, forming a first sidewall spacer proximate the gate electrode structure, and, after forming the first sidewall spacer, performing a first ion implant process using a N-type dopant to form extension implant regions in the substrate for said NMOS transistor. This illustrative method further includes the steps of, after performing the first ion implant process, performing at least one etching process to define recessed regions in the substrate and, after performing the at least one etching process, performing a second ion implant process using a N-type dopant to form source/drain implant regions below the recessed regions of the substrate.

In another example, a device is disclosed herein that includes a NMOS transistor and a PMOS transistor formed in and above a semiconducting substrate, wherein each of the transistors includes a gate electrode structure and a combination of sidewall spacers positioned proximate each of the gate electrode structures. The combination of sidewall spacers includes a silicon nitride sidewall spacer and a silicon dioxide sidewall spacer, wherein the silicon dioxide sidewall spacer is positioned between the gate electrode structure and the silicon nitride sidewall spacer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1G depict one illustrative prior art process flow for forming a semiconductor device; and FIGS. 2A-2H depict various illustrative examples of using the methods disclosed herein to form illustrative NMOS transistors with recessed source/drain regions using a novel spacer process flow.

Figure 2B:
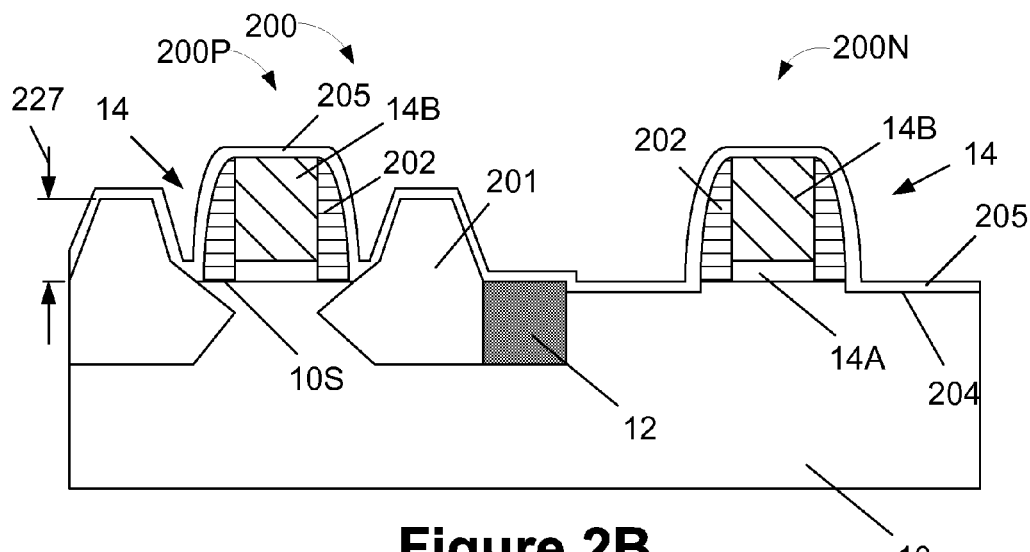

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a semiconductor device with recessed source/drain regions, and a semiconductor device that includes such regions using a novel combination of spacer materials. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 2A-2H, various illustrative embodiments of the methods and devices disclosed herein will now be described in more detail.

FIG. 2A is a simplified view of an illustrative semiconductor device 200 at an early stage of manufacturing that is formed above a semiconducting substrate 10. At the point of fabrication depicted in FIG. 2A, the device 200 has been subjected to the processing described above in FIGS. 1A-1D with the exception that raised source/drain regions 201 comprised of, for example, epitaxial silicon germanium regions, have been formed in the cavities 24 instead of the epitaxial silicon germanium regions 26 in the cavities 24, as depicted in FIG. 1D. Thus, the discussion about the illustrative materials and methods of manufacture employed in making the device 100 apply equally to the device 200 up to this point of fabrication. Of course, to the extent that like numbers of various components is used, the previous discussion of those components in connection with the device 100 applies equally as well to the device 200.

The raised source/drain regions 201 may be formed by performing an epitaxial process to deposit silicon germanium in the cavities 24. In general, the raised source/drain regions 201 are thicker or have additional overfill material as compared to the silicon germanium regions 26 depicted in FIG. 1D. This additional material may be formed by performing the epitaxial deposition process for an extended period of time. The amount of the additional overfill may vary depending upon the particular application. However, in one illustrative example, the amount raised source/drain regions 201 may have approximately 10-15 nm of additional material as compare to the silicon germanium regions 26 shown in FIG. 1D. In on example, the raised source/drain regions 201 may have an upper surface that is positioned above the upper surface of the substrate 10 by a distance 227 of about 20-40 nm. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

As will be recognized by those skilled in the art after a complete reading of the present application, the gate structures 14 may be of any desired construction and comprised of any of a variety of different materials, such as one or more conductive layers made of polysilicon or a metal, etc., and one or more layers of insulating material, such as silicon dioxide, a high-k material, etc. Additionally, the gate structure 14 for the NMOS transistor 200N may have different material combinations as compared to a gate structure 14 for the PMOS transistor 200P. Thus, the particular details of construction of gate structure 14, and the manner in which the gate structures 14 are formed, should not be considered a limitation of the present invention. For example, the gate structures 14 may be made using so-called "gate-first" or "gate-last" techniques.

Next, as shown in FIG. 2B, sidewall spacers 202 comprised of silicon dioxide, silicon oxynitride, etc. are formed proximate the gate structures 14 on both the PMOS transistor 200P and the NMOS transistor 200N. The sidewall spacer 202 may be formed by depositing a layer of spacer material and thereafter, performing an anisotropic etching process. In one example, the sidewall spacer 202 may made of silicon dioxide, and it may have a width at its base that ranges from approximately 7-10 nm. During the process of performing the etching process to define the spacers 202, the surface of the substrate 10 may be slightly recessed, as indicated by the reference number 204. The depth of the recess 204 relative to the upper surface 10S of the substrate 10 may vary depending upon the application and the particular etchant materials used in forming the spacer 202. In one illustrative example, the recess 204 may have a depth of about 2-3 nm. Next, a masking layer (not shown), e.g., such a photoresist mask, is formed so as to cover the PMOS transistor 200P and expose the NMOS transistor 200N for further processing. Then, one or more ion implantation processes are performed on the exposed NMOS transistor 200N to form various doped regions in the substrate 10, although such doped regions are not depicted in the drawings so as not to obscure the present invention. More specifically, at the point depicted in FIG. 2B, an ion implant process may be performed using an P-type dopant material to form so-called halo implant regions in the substrate 10 for the NMOS transistor 200N, and another ion implant process may be performed using a N-type dopant material to form extension implant regions for the NMOS transistor 200N. Thereafter, a very quick anneal process, such as a laser anneal process, may be performed at a temperature of about 1250° C. for about 10 milliseconds or so to repair the damaged lattice structure of the substrate 10 in the areas that were subjected to the ion implant processes discussed above. Thereafter, a thin liner layer 205 that is comprised of, for example, about 2-4 nm of silicon dioxide, may be formed on the device 200 by performing a conformal deposition process.

Figure 2C:
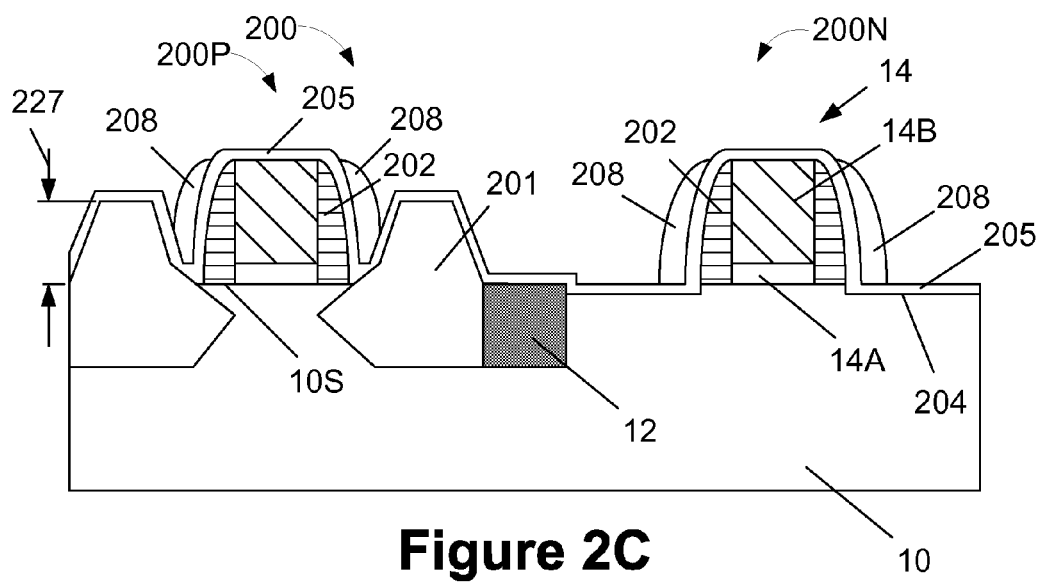

Next, as shown in FIG. 2C, in the illustrative embodiment depicted herein, sidewall spacers 208 comprised of, for example, silicon nitride, etc. are formed proximate the gate structures 14 of the PMOS transistor 200P and the NMOS transistor 200N. In this particular example, the spacers 208 are formed on the liner layer 205. The sidewall spacers 208 may be formed by depositing a layer of spacer material and thereafter, performing an anisotropic etching process. In one example, the sidewall spacers 208 may be made of silicon nitride, and it may have a width at its base that ranges from approximately 10-20 nm. In some cases the liner layer 205 may be omitted.

Figure 2D:
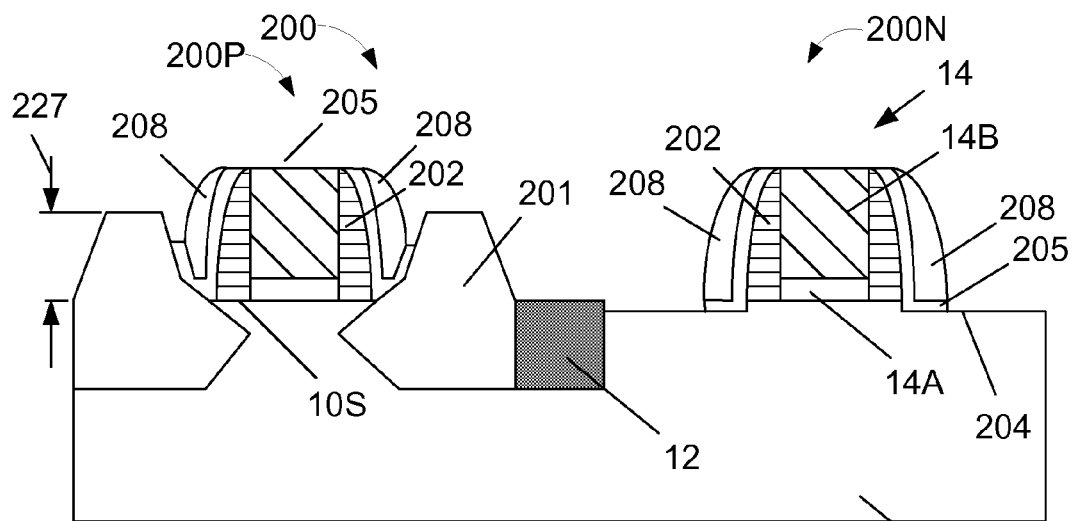

Then, as shown in FIG. 2D, an etching process is performed to remove exposed portions of the liner layer 205 to thereby expose the substrate 10 for the NMOS transistor 200N and the raised source/drain regions 201 of the PMOS transistor 200P for further processing. This etching process may be either a wet or dry etching process and it may be performed for a relatively brief period time given the very thin nature of the liner layer 205.

Figure 2E:
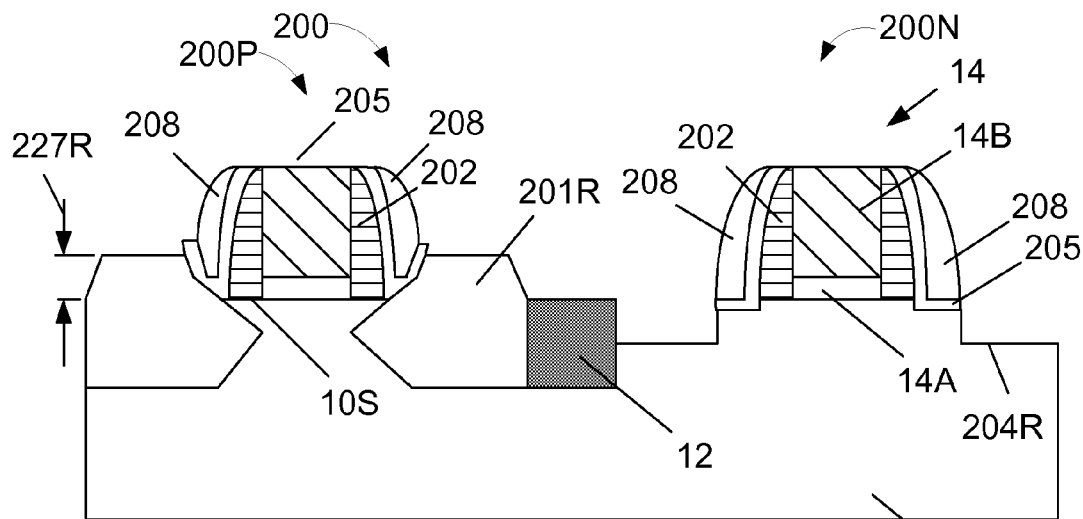

Next, as shown in FIG. 2E, a common etching process is performed on both the PMOS transistor 200P and the NMOS transistor 200N. This common etching process is performed to increase the depth of the recess 204 for the NMOS transistor 200N and to reduce the height of the raised source/drain regions 201 on the PMOS transistor 200P. More specifically, this etching process results in a recess 204R have an overall depth of about 20-30 nm, and a reduced height raised source/drain regions 201R with a height 227R of about 20-40 nm, both distances being relative to the original surface 10S of the substrate 10. Then, one or more ion implantation processes are performed to form various doped regions in the substrate 10 for both the PMOS transistor 200P and the NMOS transistor 200N, although such doped regions are not depicted in the drawings so as not to obscure the present inventions. Such doped regions may be formed using traditional techniques and material. For example, with and appropriate masking layer (not shown) over the PMOS transistor 200P, an ion implantation processes may be performed to form deep source/drain implant regions (N-type dopant) in the substrate 10 for the NMOS transistor 200N in the substrate 10 in the areas under the recess 204R, as indicated by the arrows 250. Similarly, with a masking layer in place over the NMOS transistor 200N, an ion implantation process may be performed to form deep source/drain implant regions (P-type dopant) in the reduced height raised source/drain regions 201R for the PMOS transistor 200P. Thereafter, an anneal or heating process may be performed to repair the damaged lattice structure of the substrate 10 in the areas that were subjected to the ion implant processes discussed above and to activate the implanted dopant materials.

Figure 2F:
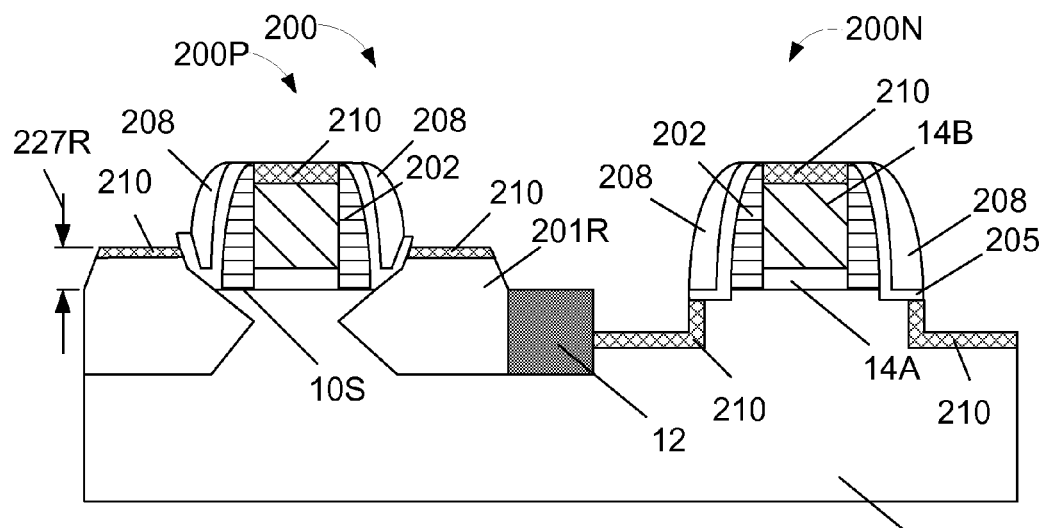

Next, as shown in FIG. 2F, metal silicide regions 210 are formed on both the PMOS transistor 200P and the NMOS transistor 200N. In the depicted example, it is assumed that the gate electrode 14B is made of silicon and thus metal silicide regions 210 are depicted as being formed on the gate electrode 14B. The metal silicide regions 210 may be made of any metal silicide and they may be formed using traditional silicidation techniques. The metal silicide regions 210 need not be the same metal silicide material on both the PMOS transistor 200P and the NMOS transistor 200N, although that may be the case. Note that, given the recess 204R formed on the NMOS transistor 200N, the metal silicide regions 210 on the source/drain regions for the NMOS transistor 200N have a generally L-shaped configuration.

Figure 2G:
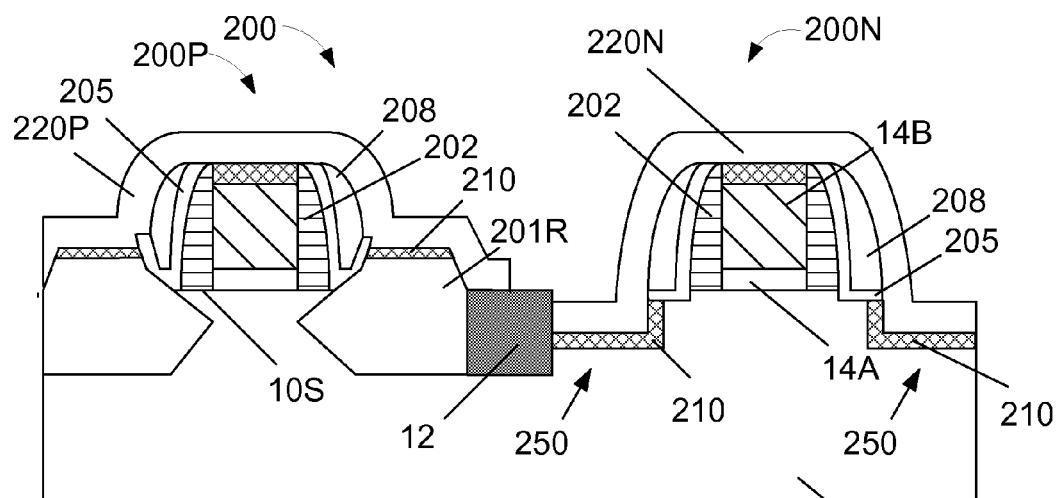

FIG. 2G depicts the device 200 after the formation of a stress inducing layer 220P on the PMOS transistor 200P and the formation of a stress inducing layer 220N on the NMOS transistor 200N. The stress inducing layers 220P, 220N may be comprised of a variety of materials, e.g., a 20-50 nm layer of silicon nitride, and they may be formed by a performing a CVD process. The purpose of the stresses inducing layers 220P, 220N is to create a desirable stress condition in the channel region of the transistors to enhance their electrical performance characteristics. More specifically, the stress inducing layer 220P is formed so as to induce a compressive stress in the channel region of the PMOS transistor 200P, while the stress inducing layer 220N is formed so as to induce a tensile stress in the channel region of the NMOS transistor 200N. The techniques used to form the stress inducing layers 220P, 220N on the transistors 200P, 200N, respectively, such that they exhibit the desired stress are well known to those skilled in the art. Note that, given the formation of the recessed source/drain regions in the areas 250 of the substrate 10, the stress inducing layer 220N is positioned closer to the channel region of the NMOS transistor 200N, thereby allowing more effective transfer of the desirable tensile stress to the channel region of the NMOS transistor 200N.

Figure 2H:
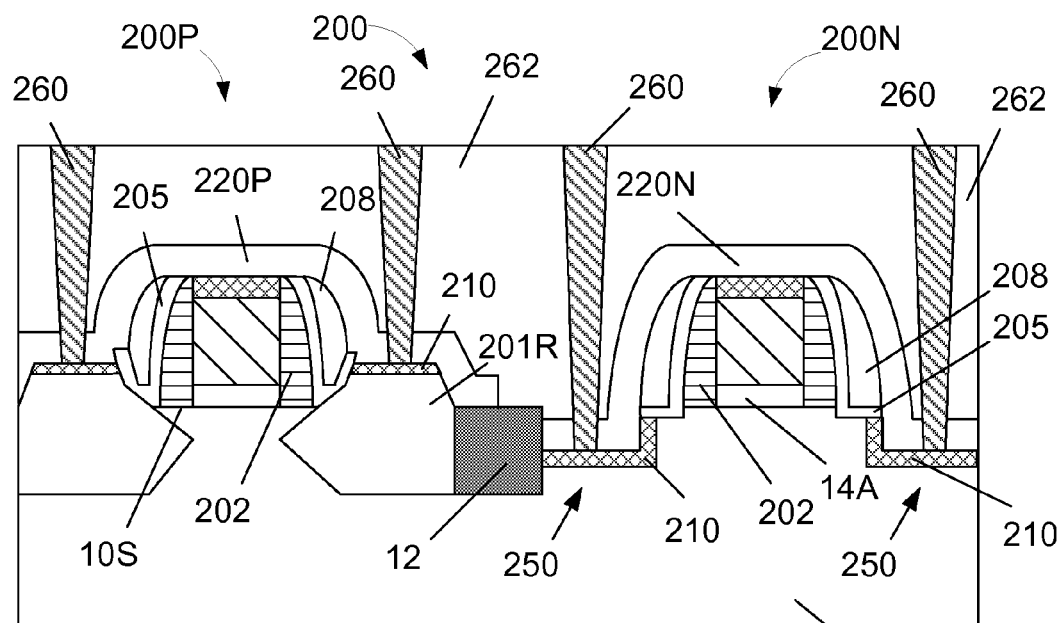

As shown in FIG. 2H, a plurality of conductive contacts 260 are formed in a layer of insulating material 262 for the device 200. The conductive contacts 260 are illustrative in nature and they may be manufactured using traditional techniques and materials. The conductive contacts 260 provide electrical connection to the underlying source/drain regions of the transistors 200P, 200N. At a high level, the silicon dioxide spacers 202 and the silicon nitride spacers 208 disclosed herein constitute a combination of sidewall spacers that are formed proximate the gate structures 14 of both the PMOS transistor 200P and the NMOS transistor 200N, with the silicon dioxide spacer 202 being positioned between the gate structures 14 and the silicon nitride spacer 208. In some case, this spacer combination may have one or more liner layers formed between the spacers 202, 208 and/or between the spacer 202 and the gate structure 214.

Using the methodologies disclosed herein, in contrast to prior art devices, the silicon dioxide spacers 202 are positioned between the gate electrode structures 14 and the conductive contacts 260 which may tend to eliminate or reduce the fringe capacitance problem discussed in the background section of the application. At the point depicted in FIG. 2H, various additional processing operations are performed on the device 200 to complete its fabrication. Such additional processing operations may include the formation of additional metallization layers (not shown) above the device 200 using known techniques. Of course, the total number of metallization layers may vary depending on the particular device under construction.

It should be noted that, when it is stated in this detailed description or in the claims, that certain spacers or combinations of spacers are positioned "proximate" to a structure or component, such as a gate structure, such language will be understood to cover situations where such a spacer or combinations of spacers actually contacts the structure or component, as well as a situation where there are one or more intervening layers of material between the spacer and the structure or component. For example, in some cases, there may be a liner layer or other spacers positioned between the referenced spacer and referenced structure, such as the illustrative gate structures 14 depicted herein. Additionally, the fact that the claims may make shorthand reference to a "first" spacer or a "first" type of process, such language does not mean that such a spacer or process was literally the first such spacer or process that was made or performed on the device 200.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate electrode structure of a NMOS transistor above a surface of a semiconducting substrate;
    forming a first sidewall spacer proximate said gate electrode structure;
    after forming said first sidewall spacer, performing a first ion implant process using a N-type dopant to form extension implant regions in said substrate for said NMOS transistor;
    after performing said first ion implant process, performing at least one etching process to define recessed regions in said substrate; and
    after performing said at least one etching process, performing a second ion implant process using a N-type dopant to form source/drain implant regions below said recessed regions of said substrate.

2. The method of claim 1, further comprising performing at least one heating process to activate dopants implanted during said first and second ion implant processes.

3. The method of claim 1, further comprising, prior to performing said at least one etching process, forming a liner layer on said first sidewall spacer and forming a second sidewall spacer on said liner layer.

4. The method of claim 3, wherein said first sidewall spacer and said liner layer are each comprised of silicon dioxide and said second sidewall spacer is comprised of silicon nitride.

5. The method of claim 1, further comprising forming a stress inducing layer above said NMOS transistor and in said recessed regions of said substrate, said stress inducing layer adapted to induce a tensile stress in a channel region of said NMOS transistor.

6. A method, comprising:
    forming a gate electrode structure of a NMOS transistor above a surface of a semiconducting substrate;
    forming a first sidewall spacer comprised of silicon dioxide proximate said gate electrode structure;
    after forming said first sidewall spacer, performing a first ion implant process using a N-type dopant to form extension implant regions in said substrate for said NMOS transistor;
    forming a second sidewall spacer proximate said first sidewall spacer;
    after forming said second sidewall spacer, performing at least one etching process to define recessed regions in said substrate; and
    after performing said at least one etching process, performing a second ion implant process using a N-type dopant to form source/drain implant regions below said recessed regions of said substrate.

7. The method of claim 6 further comprising, prior to forming said second sidewall spacer, forming a liner layer on said first sidewall spacer and forming said second sidewall spacer on said liner layer.

8. The method of claim 6, further comprising forming a stress inducing layer above said NMOS transistor and in said recessed regions of said substrate, said stress inducing layer adapted to induce a tensile stress in a channel region of said NMOS transistor.

9. A method of forming a PMOS transistor and a NMOS transistor, said NMOS transistor comprising recessed source/drain regions, the method comprising:

forming a gate electrode structure for said PMOS transistor and a gate electrode structure for said NMOS transistor above a surface of a semiconducting substrate;

forming a plurality of cavities in said substrate proximate said gate electrode structure of said PMOS transistor;

performing an epitaxial deposition process to form raised silicon-germanium regions is said cavities of said PMOS transistor, said raised silicon-germanium regions having an amount of silicon-germanium material positioned above a surface of said semiconducting substrate; and after forming said raised silicon-germanium regions, performing a common etching process on said PMOS transistor and said NMOS transistor to define recessed regions in said substrate proximate said gate electrode structure of said NMOS transistor and to reduce said amount of said silicon-germanium material positioned above said surface of said substrate for said PMOS transistor.

10. The method of claim 9, further comprising:

forming a tensile stress inducing layer above said NMOS transistor and in said recessed regions of said substrate, said tensile stress inducing layer adapted to induce a tensile stress in a channel region of said NMOS transistor; and forming a compression stress inducing layer above said PMOS transistor, said compression stress inducing layer adapted to induce a compressive stress in a channel region of said PMOS transistor.

11. The method of claim 9, prior to forming said plurality of cavities for said PMOS transistor, performing a first ion implant process using a P-type dopant to form extension implant regions in said substrate for said PMOS transistor.

12. The method of claim 11, wherein, prior to forming said recessed regions in said substrate proximate said gate electrode structure of said NMOS transistor, performing a second ion implant process using a N-type dopant to form extension implant regions in said substrate for said NMOS transistor.

13. The method of claim 12, wherein, after performing said first and second ion implant processes, performing at least one additional ion implant process to form source/drain implant regions in said substrate for said PMOS transistor and said NMOS transistor, said source/drain implant regions for said PMOS transistor comprising P-type dopant material, said source/drain regions for said NMOS transistor comprising N-type dopant material and being positioned beneath said recessed regions of said substrate.

14. A method of forming a PMOS transistor and a NMOS transistor, said NMOS transistor comprising recessed source/drain regions, the method comprising:

forming a gate electrode structure for said PMOS transistor and a gate electrode structure for said NMOS transistor above a surface of a semiconducting substrate;

performing a first ion implant process using a P-type dopant to form extension implant regions in said substrate for said PMOS transistor;

after performing said first ion implant process, forming a plurality of cavities in said substrate proximate said gate electrode structure of said PMOS transistor;

performing an epitaxial deposition process to form raised silicon-germanium regions is said cavities of said PMOS transistor, said raised silicon-germanium regions having an amount of silicon-germanium material positioned above a surface of said semiconducting substrate;

after forming said raised silicon-germanium regions, performing a second ion implant process using a N-type dopant to form extension implant regions in said substrate for said NMOS transistor;

after performing said second ion implant process, performing at least one common etching process on said PMOS transistor and said NMOS transistor to define recessed regions in said substrate proximate said gate electrode structure of said NMOS transistor and to reduce said amount of said silicon-germanium material positioned above said surface of said substrate for said PMOS transistor; and after forming said recessed regions in said substrate proximate said gate electrode of said NMOS transistor, performing at least one additional ion implant process to form source/drain implant regions in said substrate for said PMOS transistor and said NMOS transistor, said source/drain implant regions for said PMOS transistor comprising P-type dopant material, said source/drain regions for said NMOS transistor comprising N-type dopant material and being positioned beneath said recessed regions of said substrate.

15. The method of claim 14, further comprising:

forming a tensile stress inducing layer above said NMOS transistor and in said recessed regions of said substrate, said tensile stress inducing layer adapted to induce a tensile stress in a channel region of said NMOS transistor; and forming a compression stress inducing layer above said PMOS transistor, said compression stress inducing layer adapted to induce a compressive stress in a channel region of said PMOS transistor.

* * * * *